US009429803B2

(12) United States Patent
Park et al.

(10) Patent No.: US 9,429,803 B2
(45) Date of Patent: Aug. 30, 2016

(54) LOGO PATTERNING METHODS FOR LIQUID CRYSTAL DISPLAYS

(71) Applicant: Apple Inc., Cupertino, CA (US)

(72) Inventors: Kwang Soon Park, Cupertino, CA (US); Byung Duk Yang, Cupertino, CA (US); Robin Huang, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 119 days.

(21) Appl. No.: 14/549,309

(22) Filed: Nov. 20, 2014

(65) Prior Publication Data

US 2015/0301417 A1    Oct. 22, 2015

Related U.S. Application Data

(60) Provisional application No. 61/982,768, filed on Apr. 22, 2014.

(51) Int. Cl.
| | |
|---|---|
| *G02F 1/1335* | (2006.01) |
| *G02F 1/1362* | (2006.01) |
| *G02F 1/1368* | (2006.01) |
| *H01L 27/12* | (2006.01) |
| *G02F 1/1333* | (2006.01) |

(52) U.S. Cl.
CPC ....... *G02F 1/136209* (2013.01); *G02F 1/1368* (2013.01); *G02F 1/133514* (2013.01); *G02F 1/133553* (2013.01); *H01L 27/1218* (2013.01); *H01L 27/1222* (2013.01); *H01L 27/1248* (2013.01); *G02F 2001/133357* (2013.01)

(58) Field of Classification Search
CPC ........... G02F 1/136209; G02F 1/1368; G02F 1/133514; G02F 1/133553; G02F 2001/133357; H01L 27/1222; H01L 27/1248; H01L 27/1218

USPC .......................................................... 349/62
See application file for complete search history.

(56) References Cited

U.S. PATENT DOCUMENTS

| | | | |
|---|---|---|---|
| 8,004,635 B2 | 8/2011 | Lee et al. | |
| 8,698,993 B2 | 4/2014 | Lee | |
| 2006/0262565 A1* | 11/2006 | Shimura | G02B 6/0056 362/616 |
| 2010/0182267 A1 | 7/2010 | Lee et al. | |
| 2012/0154725 A1 | 6/2012 | Jeon et al. | |
| 2012/0170284 A1* | 7/2012 | Shedletsky | G02F 1/13318 362/355 |
| 2013/0342927 A1 | 12/2013 | Hino et al. | |
| 2015/0131035 A1* | 5/2015 | Chen | G02B 5/305 349/96 |

* cited by examiner

*Primary Examiner* — Hoan C Nguyen
(74) *Attorney, Agent, or Firm* — Treyz Law Group; Jason Tsai

(57) ABSTRACT

A display may have a thin-film transistor (TFT) layer and a color filter layer. The TFT layer may have a first substrate, a first black masking layer, a planarization layer, and a layer of TFT circuitry on the planarization layer. The color filter layer may have a second substrate and a second black masking layer on the second substrate. A portion of the inactive area may serve as a logo area for displaying desired information to the user. A reflective structure may be formed on the bottom surface of the planarization layer, on the bottom surface of the first substrate, on the bottom surface of the second substrate, or on the upper surface of the first substrate in the logo area. In another embodiment, the logo area may be backlit by transmitting light through one or more openings in the first and second black masking layers in the logo area.

20 Claims, 13 Drawing Sheets

LOGO PATTERNING METHODS FOR LIQUID CRYSTAL DISPLAYS

This application claims the benefit of provisional patent application No. 61/982,768, filed Apr. 22, 2014, which is hereby incorporated by reference herein in its entirety.

BACKGROUND

This relates generally to electronic devices and, more particularly, to electronic devices with displays.

Electronic devices often include displays. For example, cellular telephones, computers, and televisions have displays.

A display such as a liquid crystal display has an active area filled with an array of display pixels. The active area is surrounded by an inactive border area. In some displays, a logo may be patterned in the inactive border area. The location of the logo within the inactive border area may be referred to as a logo area.

Conventional liquid crystal displays include a first polarizer layer, a thin-film transistor glass layer formed over the first polarizer layer, a color filter glass layer formed over the thin-film transistor glass layer, a second polarizer layer formed over the color filter glass layer, and a cover glass layer formed over the second polarizer layer in that order. In particular, a black masking layer is formed on a surface of the cover glass layer that faces the second polarizer layer. A portion of the cover glass black masking layer in the exact shape of the logo is removed in the logo area. A reflective metal layer is formed within the cutout portion of the cover glass masking layer. The reflective metal layer serves to reflect ambient light such that a user of the display can see the logo.

In an effort to reduce the thickness of liquid crystal displays, a flipped panel display has been developed where the thin-film transistor glass layer is formed over the color filter glass layer. Arranged in this flipped configuration, the cover glass layer can be eliminated. As described above, the logo of the display, however, is formed on the cover glass layer. It would therefore be desirable to be able to provide ways of patterning logos for flipped panel displays.

SUMMARY

An electronic device may be provided with a display such as a liquid crystal display. The liquid crystal display may have an upper polarizer and a lower polarizer. A layer of liquid crystal material may be interposed between a thin-film transistor layer and a color filter layer. The thin-film transistor layer may be interposed between the liquid crystal layer and the upper polarizer. The color filter layer may be interposed between the liquid crystal layer and the lower polarizer.

The thin-film transistor layer and color filter layer may have an associated array of display pixels that define an active area for the display. The display pixels of the active area may be used to display images for a user. An inactive border area in the display may run along the periphery of the active area. Light blocking structures in the inactive area may prevent stray backlight from a backlight light guide plate from leaking out of the display.

The thin-film transistor (TFT) layer may include a clear TFT substrate, a TFT black masking layer formed on the clear TFT substrate, a planarization layer formed over the TFT black masking layer, and TFT structures formed over the planarization layer. The color filter (CF) layer may include a clear CF substrate and a CF black masking layer formed on the clear CF substrate.

In one suitable arrangement, the display may include one or more reflective structures that is formed in the inactive border area and that is configured to reflect ambient light to display predetermined information to a user of the display (e.g., to display static information such as a logo, a symbol, one or more letters, one or more numbers, etc.). The reflective structure may be formed from aluminum, molybdenum, copper, silver, gold, reflective adhesive, or other suitable material with sufficient reflectance. The reflective structure may be aligned with at least one hole in the TFT black masking layer. The reflective structure may be formed using TFT structures formed over the planarization layer, may be formed directly in the hole in the planarization layer, may be formed on the bottom surface of the CF substrate, and may be formed on the top surface of the TFT substrate (as examples). In at least some of these embodiments, at least one hole may be formed in the CF black masking layer that is aligned with the reflective structure.

In another suitable arrangement, the display may include an auxiliary backlight unit for displaying dynamic information in the inactive border area to a user of the display. In particular, a first hole may be formed in the TFT black masking layer, whereas a second hole may be formed in the CF black masking layer. The first and second holes may be laterally aligned with each other. In some embodiments, the display may include electrode structures for controlling the backlight that passes through the first and second holes. The electrodes may, for example, be used for controlling the brightness and/or the color of the backlight passing through the first and second holes.

Further features of the present invention, its nature and various advantages will be more apparent from the accompanying drawings and the following detailed description.

DETAILED DESCRIPTION

Illustrative electronic devices of the types that may be provided with displays are shown in FIGS. 1, 2, 3, and 4.

Figure 1:
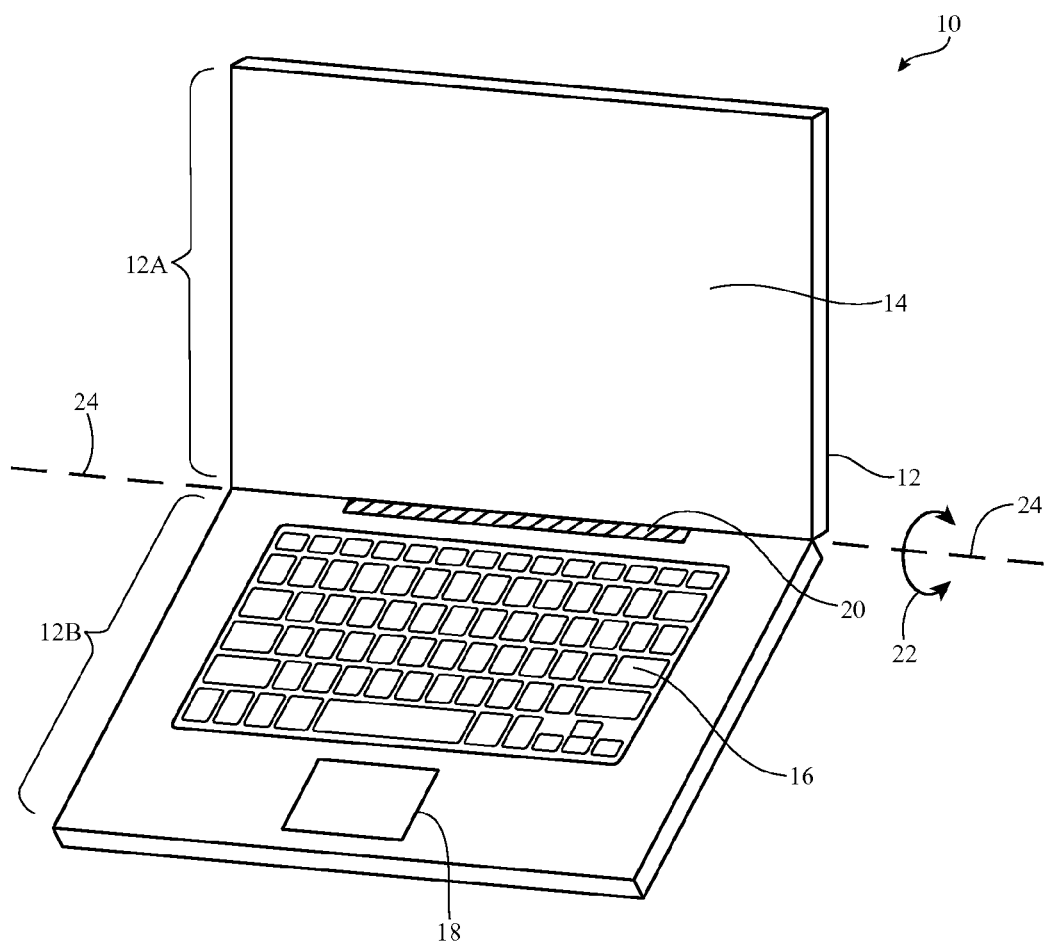
FIG. 1 is a perspective view of an illustrative electronic device such as a laptop computer with a display in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B about rotational axis 24.

Figure 2:
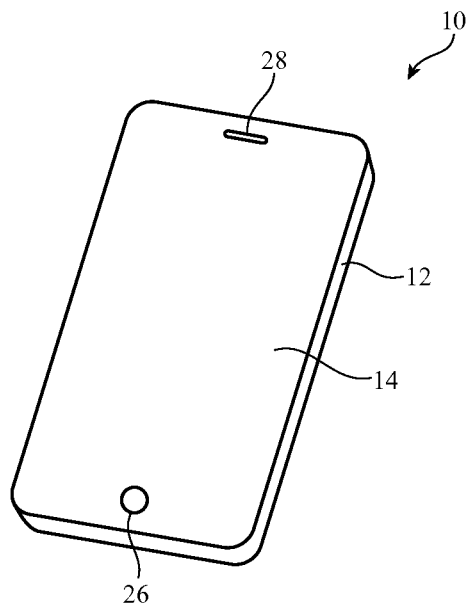
FIG. 2 is a perspective view of an illustrative electronic device such as a handheld electronic device with a display in accordance with an embodiment.

FIG. 2 shows an illustrative configuration for electronic device 10 based on a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer that includes openings for components such as button 26 and speaker port 28. Device 10 may, if desired, be a compact device such as a wrist-mounted device or pendant device (as examples).

Figure 3:
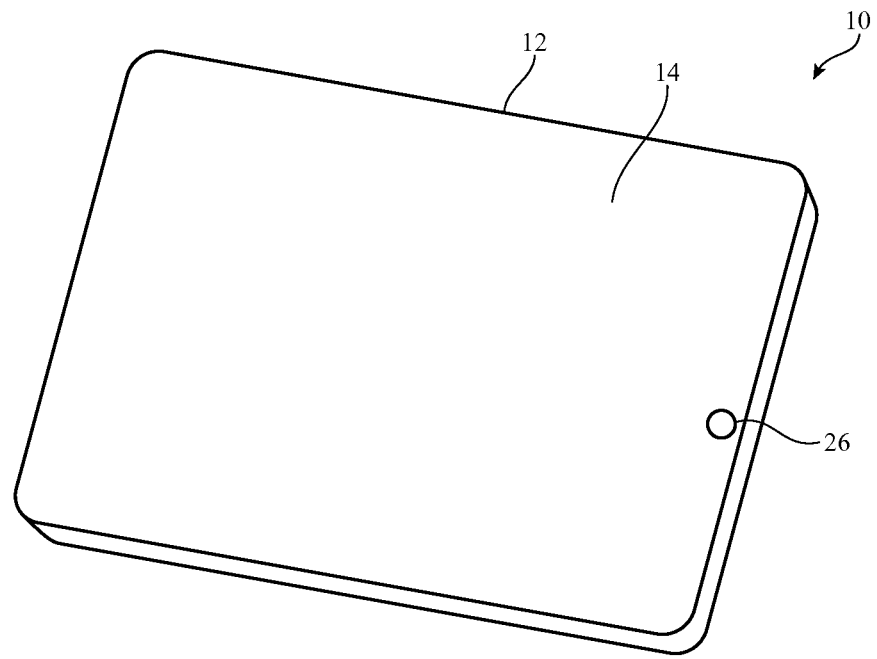
FIG. 3 is a perspective view of an illustrative electronic device such as a tablet computer with a display in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an opening to accommodate button 26.

Figure 4:
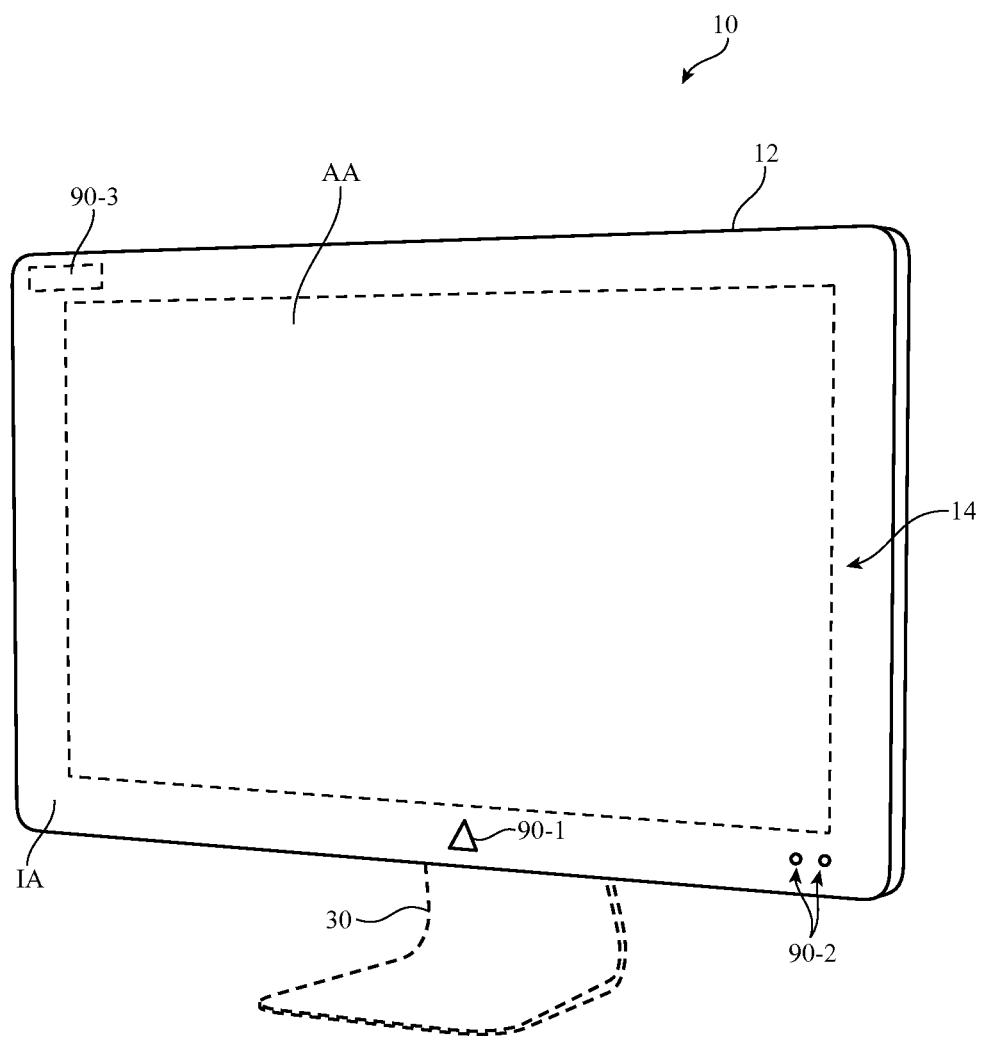
FIG. 4 is a perspective view of an illustrative electronic device such as a display for a computer or television with a display in accordance with an embodiment.

FIG. 4 shows an illustrative configuration for electronic device 10 in which device 10 is a computer display, a computer that has an integrated computer display, or a television. Display 14 is mounted on a front face of housing 12. With this type of arrangement, housing 12 for device 10 may be mounted on a wall or may have an optional structure such as support stand 30 to support device 10 on a flat surface such as a table or desk.

As shown in FIG. 4, display 14 may have an active area AA in which display pixels are formed to display image data. Active area AA may be surrounded by an inactive border area IA. In general, it may be desirable to minimize the width of the inactive border area, in some embodiments, additional visual information may be provided in inactive area IA of display 14. In the example of FIG. 4, border display areas 90-1, 90-2, and 90-3 may be provided in the inactive area IA. A logo having the shape of a triangle, the shape of a fruit, or other suitable shapes, one or more letters, and/or other visual designs may be formed in area 90-1. Area 90-1 in which a logo for device 10 is patterned is sometimes referred to herein as a logo area. A power indicator that is lit when display 14 is activated and that is dimmed when display 14 is idle may be formed in area 90-2. An opening that receives infrared (IR) signals from remote control device may be formed in area 90-2. Display information indicative of the current time, the current power level, the current television channel to which device 10 is tuned, the current performance of device 10, and/or other suitable information may be displayed in area 90-3. These examples area merely illustrative and does not serve to limit the scope of the present description, in general, any suitable number of border display areas 90 and any desired type of information may be displayed in areas 90 within inactive border area IA.

Figure 5:
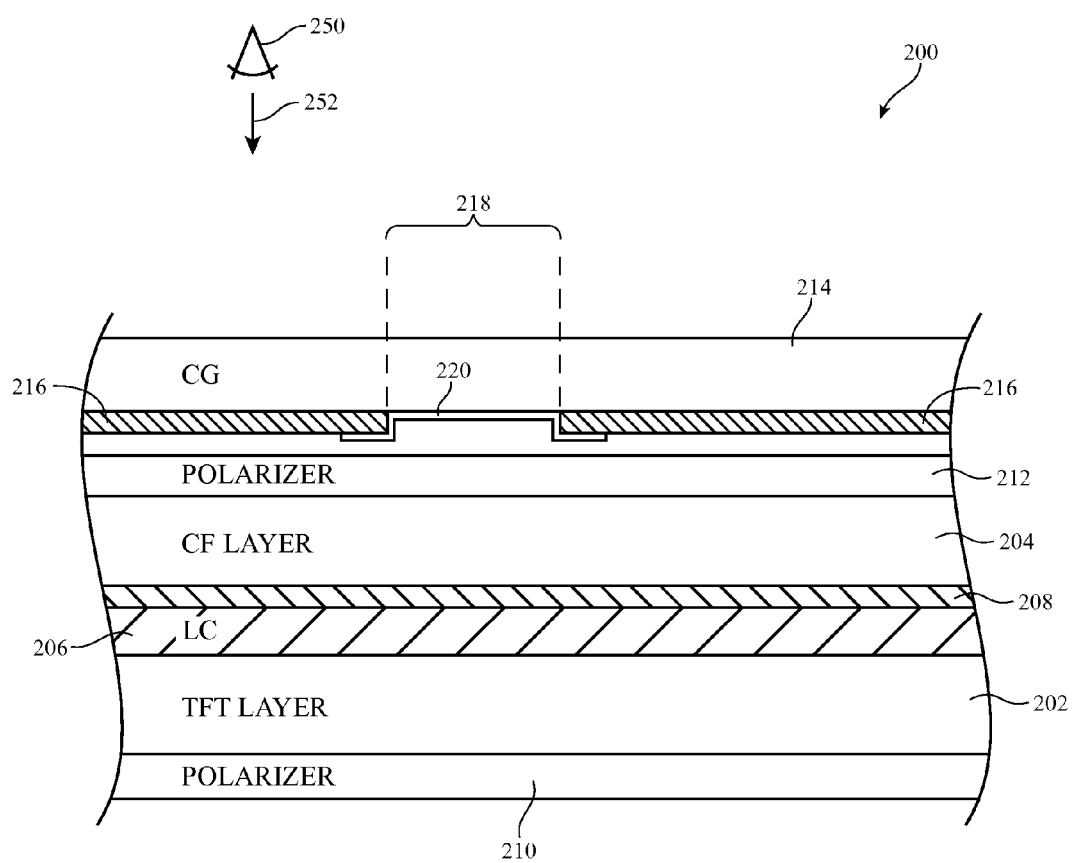
FIG. 5 is a cross-sectional side view of a conventional liquid crystal display.

FIG. 5 shows a cross-sectional side view of a conventional liquid crystal display 200. As shown in FIG. 5, display 200 includes a thin-film transistor layer 202 and a color filter layer 204 formed on top of the thin-film transistor layer 202. A black masking layer 208 is formed as part of color filter layer 204. Liquid crystal material 206 is sandwiched between thin-film transistor layer 202 and color filter layer 204. Layers 202 and 204 are then sandwiched between a first polarizer 210 and a second polarizer 212. Cover glass 214 is formed on second polarizer 212. In particular, a black masking layer 216 is formed on the bottom surface of cover glass 214.

A portion of black masking layer 216 corresponding to logo area 218 is removed. A metallic layer 220 that overlaps with at least the cutout portion is formed on the bottom surface of cover glass 214. Formed in this way, display 200 being viewed by user 250 in direction 252 can see the logo in region 218 since ambient light will be reflected off of layer 220.

Figure 6:
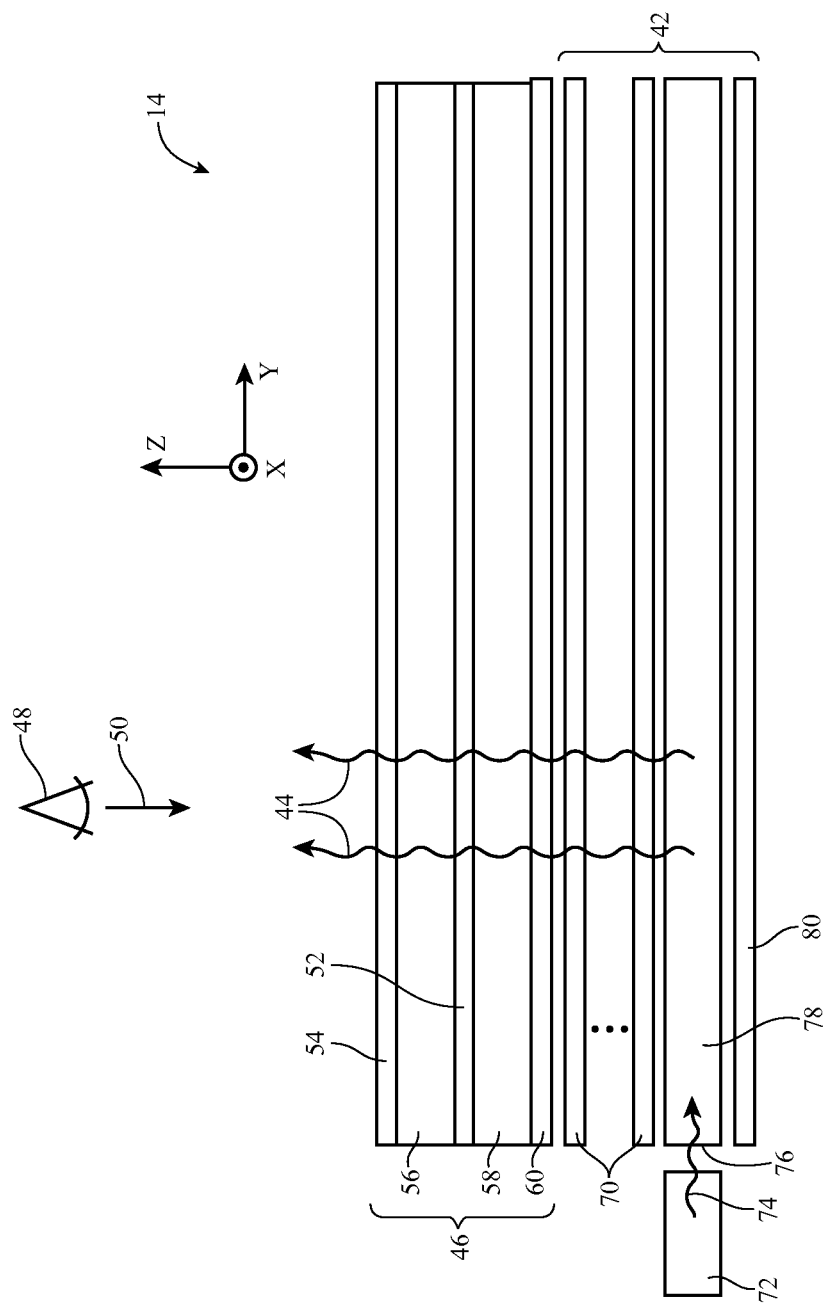
FIG. 6 is a cross-sectional side view of an illustrative display in accordance with an embodiment.

In accordance with at least some embodiments, display 14 is formed using a display arrangement that does not include any cover glass and that rearranges the orientation of at least some display layers. Display 14 may be a liquid crystal display or a display formed using other suitable display technologies. A cross-sectional side view of an illustrative configuration for display 14 of device 10 (e.g., a liquid crystal display for the devices of FIG. 1, FIG. 2, FIG. 3, FIG. 4 or other suitable electronic devices) is shown in FIG. 6. As shown in FIG. 6, display 14 may include backlight structures such as backlight unit 42 for producing backlight 44. During operation, backlight 44 travels outwards (vertically upwards in dimension Z in the orientation of FIG. 6) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion of housing 12).

Display layers 46 may include a liquid crystal layer such a liquid crystal layer 52. Liquid crystal layer 52 may be sandwiched between display layers such as display layers 58 and 56. Layers 56 and 58 may be interposed between lower (innermost) polarizer layer 60 and upper (outermost) polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, outer substrate layer 56 may be a thin-film transistor layer that includes an array of thin-film transistors and associated electrodes (display pixel electrodes) for applying electric fields to liquid crystal layer 52 and thereby displaying images on display 14. Inner substrate layer 58 may be a color filter layer that includes an array of color filter elements for providing display 14 with the ability to display color images.

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 6, optical films 70 and reflector 80 may have a matching rectangular footprint.

Display 14 may have an array of display pixels (e.g., a rectangular array having rows and columns) for displaying images to a viewer. Vertical signal lines called data lines may be used to carry display data to respective columns of display pixels. Horizontal signal lines called gate lines may be used to carry gate line signals (sometimes referred to as gate control signals or gate signals) to respective rows of display pixels. The outline of the array of display pixels in display 14 defines an active area for display 14. The active area may have a rectangular shape and may be surrounded by an inactive border region. An inactive border area may, for example, run along one edge, two edges, three edges, or all four edges of the active area.

Figure 7:
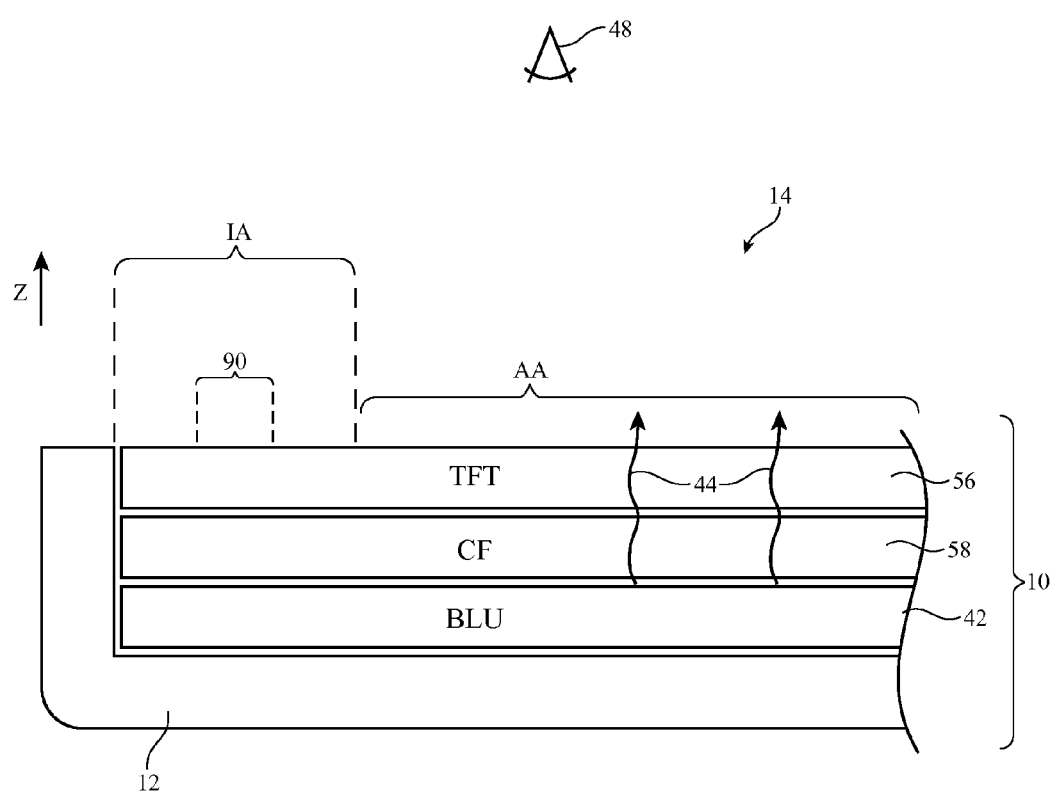
FIG. 7 is a cross-sectional side view of a portion of an illustrative electronic device showing how an edge of a display in the device may be free of overlapping housing structures in accordance with an embodiment.

A cross-sectional side view of an illustrative electronic device having a display such as display 14 of FIG. 6 is shown in FIG. 7. As shown in FIG. 7, images may be displayed on central active area AA of display 14. Inactive area IA may have a rectangular ring shape that runs around the rectangular periphery of active area AA. To avoid unsightly bezel structures in device 10, it may be desirable to keep inactive area IA free of overlapping housing structures, bezels, or other potentially unattractive border structures.

To avoid light leakage in inactive area IA (e.g., to prevent stray light from escaping in the absence of a bezel or other overlapping structure), display 14 may be provided with border masking structures in inactive area IA. The border masking structures may help block stray backlight from backlight unit 42 and thereby ensure that border IA does not allow excess light to escape. Backlight from backlight unit 42 will therefore be confined to active area AA.

To provide satisfactory light blocking capabilities in inactive area IA, light blocking structures can be formed in at least two parts (e.g., two layers). A first part of the light blocking structures may be formed from a black masking layer on the underside of thin-film transistor layer 56. In active area AA, the black masking layer may be patterned to form a black mask. The black mask is a grid-shaped series of intersecting black lines that define a rectangular array of clear display pixel openings in the thin-film transistor layer. Each of the openings in the black mask is aligned with a respective color filter element in a corresponding array of color filter elements on color filter layer 58. The grid-shaped black mask on the thin-film transistor layer may sometimes be referred to as a "black matrix." In inactive area IA, the black mask may form the first part of the light blocking structures. The second part of the light blocking structures may be formed from another black masking layer on the color filter layer 58.

Still referring to FIG. 7, border display area such as logo area 90 may be formed within inactive region IA. In one suitable arrangement, a portion of the black masking layer on the underside of thin-film transistor layer 56 may be cut out in the shape of the logo. Reflective structures may be formed from the underside of the thin-film transistor layer 56 so that user 48 can clearly see the logo in region 90. In another suitable arrangement, a portion of the black masking layer on the underside of the thin-film transistor layer 56 and a portion of the black masking layer formed on color filter layer 58 may both be cut out in the shape of the logo. Reflective structures may be formed from the underside of color filter layer 58 so that user 48 can clearly see the logo in region 90.

In yet another suitable arrangement, reflective structures patterned in the exact shape of the logo can be formed in area 90 on the topside of thin-film transistor layer 56 to help user 48 identify the logo. In yet another suitable arrangement, a separate backlight unit may be used to transmit backlight through a cutout portion of the black masking layer on color filter layer 58 and through a cutout portion of the black masking layer on thin-film transistor layer 56 so that user 48 can see a backlit logo region 90. Area 90 in these different embodiments need not be used exclusively for logos. In general, area 90 patterned as such can be used to display any desired type of information in the inactive border region. These embodiments are shown and described in connection with at least FIGS. 8-12.

Figure 8:
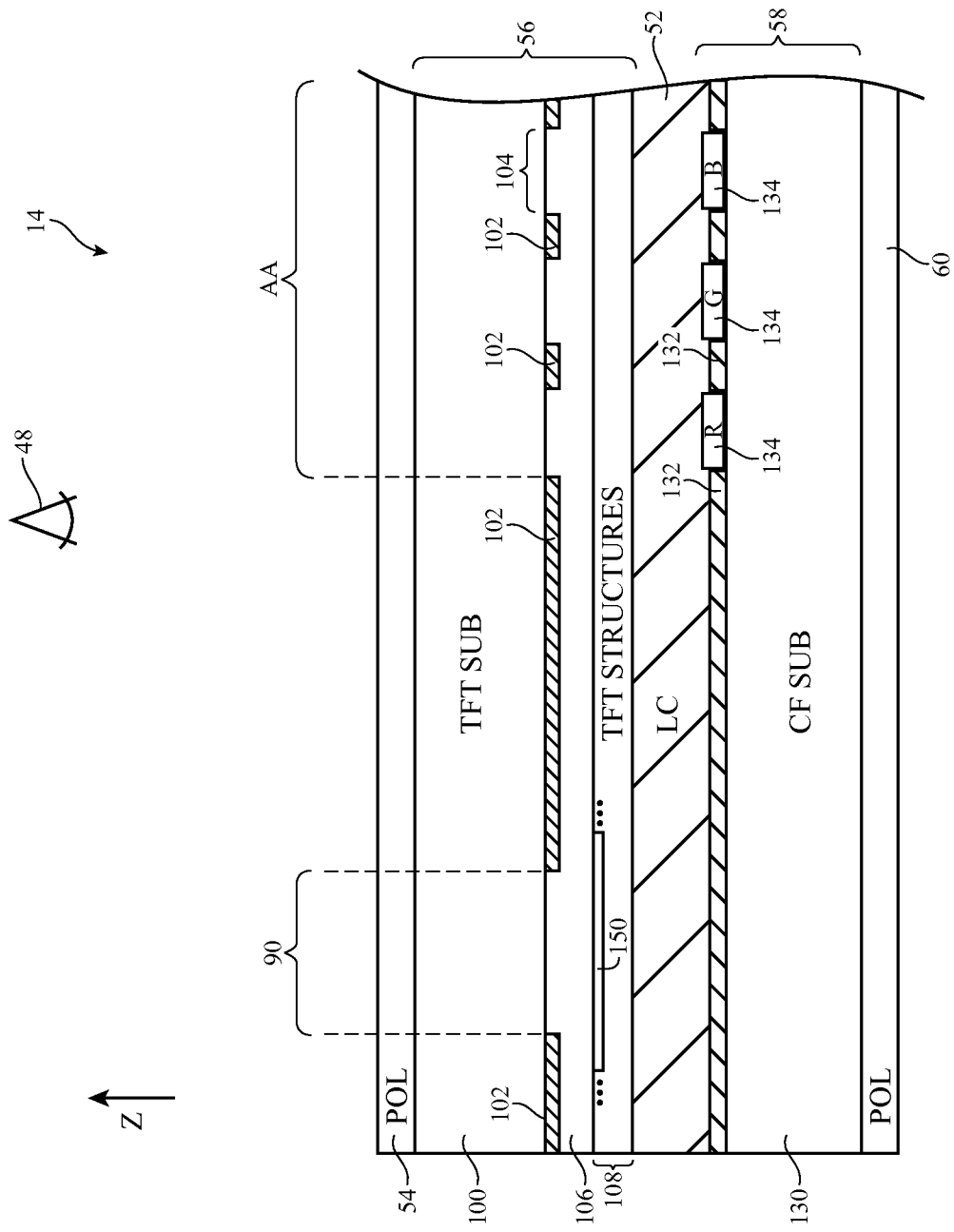
FIG. 8 is a cross-sectional side view of an illustrative display having logo reflective structures formed using thin-film transistor structures in accordance with an embodiment.

FIG. 8 is a more detailed cross-sectional side view of display 14. As shown in FIG. 8, display 14 may have an active area AA (e.g., a central rectangular active area filled with display pixels) and may have an inactive area IA that runs along the periphery of active area AA. Thin-film transistor layer 56 is located above color filter layer 58. Liquid crystal (LC) material 52 may be interposed between thin-film transistor layer 56 and color filter layer 58.

Thin-film transistor layer 56 may include a thin-film transistor (TFT) substrate 100, a black masking layer 102, a planarization layer 106, and thin-film transistor circuitry such as thin-film transistor circuitry layer 108. Substrate 100 may be formed from a clear planar structure such as a sheet of transparent plastic, transparent glass, or other clear substrate layer. Black masking (BM) layer 102 may be patterned to form a black matrix in active area AA of display 14 and may be patterned to form part of a light-blocking black mask border in inactive area IA. Black masking layer 102 formed on TFT substrate 100 is sometimes referred to as a thin-film transistor black masking layer (i.e., a TFT BM layer) or a TFT opaque masking layer. Black masking layer 102 may be patterned to form display pixel openings such as openings 104 that are aligned with corresponding color filter elements 134 in the color filter layer 58.

Black masking material 102 may be formed from a photoimageable material such as black photoresist. The black photoresist may be formed from a polymer such as polyimide. To withstand the elevated temperatures involved in subsequent thin-film transistor fabrication steps, the polymer that is used in forming TFT black masking material 102 preferably can withstand elevated temperatures (e.g., temperatures of 350° C. or higher or other suitable elevated temperatures). Opaque filler materials such as carbon black and/or titanium black may be incorporated into the polyimide or other polymer of layer 102, so that layer 102 is opaque and is able to block at least part of the stray light in inactive area IA.

Planarization layer 106 is used to planarize black masking layer 102 so that thin-film transistor structures can be formed on black masking layer 102. With one suitable arrangement, planarization layer 106 is formed from a black mask compatible material having a low dielectric constant such as a spin-on glass (SOG). For example, planarization layer 106 may be formed from a spin-on glass such as a silicon oxide based spin-on glass (e.g., a silicate spin-on glass). During thin-film transistor formation, the thin-film transistor structures and associated routing circuitry in layer 108 may be subjected to elevated processing temperatures (e.g., temperatures of 350° C. or higher). Polyimide black mask layer 102 and spin-on glass planarization layer 106 are preferably able to withstand processing at these elevated temperatures (i.e., spin-on glass layer 106 will not experience diminished transparency and polyimide layer 102 will not degrade).

Color filter layer 58 may have a transparent substrate such as substrate 130. Substrate 130 may be formed from a planar layer of clear glass, a transparent plastic layer, or other transparent substrate material. An array of color filter elements 134 (referred to collective as a color filter array or CFA) may be formed on the surface of substrate 130. Color filter elements 134 may include red color filter elements R, blue color filter elements B, and green color filter elements G. This is merely illustrative. If desired, the color filter array may include cyan color filter elements, magenta color filter elements, yellow color filter elements, clear color filter elements, and/or other suitable color filter elements. Color filter elements 134 may be formed from colored photoimageable polymers.

A layer of opaque masking material such as black photoimageable polymer layer 132 may form a black matrix in active area AA. The black matrix may have a grid shape with an array of rectangular openings. A respective color filter element 134 may be formed in each opening in the black matrix formed from opaque masking layer 134 on color filter substrate 130. Each color filter element 134 in the array of color filter elements on color filter layer 58 may be laterally aligned with a respective opening 104 in the array of openings in the black matrix formed from layer 102 on the inner surface of thin-film transistor substrate layer 100 (i.e., each display pixel in display 14 may have an opening 104, an associated display pixel electrode in layer 108, and an associated aligned color filter element 134 through which backlight passes). Some of black masking layer 132 on substrate 130 may extend into inactive area IA and may help to block stray light from the backlight unit.

As shown in FIG. 8, a portion of the TFT black masking layer 102 may be removed to provide an opening/hole in area 90 (e.g., areas 90-1, 90-2, and 90-3 in FIG. 4). The opening in layer 102 in area 90 may have any desired shape. If desired, one or more openings in layer 102 may be formed in area 90; two or more openings in layer 102 may be formed in area 90; seven or more openings in layer 102 may be formed in area 90; etc. As an example, the opening(s) in layer 102 in region 90 may exhibit the exact shape of a logo. As another example, the opening(s) in layer 102 within region 90 may have a circular shape, a square shape, a rectangular shape, or other regular polygonal shape that is easy to manufacturing. As yet another example, the opening(s) in layer 102 within region 90 may be configured to display one or more characters, numbers, symbols, or other useful information to the user of device 10.

In the arrangement of FIG. 8, a reflective structure such as structure 150 may be formed in layer 108. Layer 108 may actually include multiple dielectric layers in which thin-film transistor (TFT) structures can be formed. For example, layer 108 may include a thin-film transistor having a gate structure formed in a first dielectric layer and source-drain material formed in a second dielectric layer that is different than the first dielectric layer in layer 108. The source-drain material may be formed from polysilicon, indium gallium zinc oxide, amorphous silicon, or other semiconducting material (as examples). The thin-film transistor may be coupled to pixel electrodes (e.g., control electrodes that emit electromagnetic fields towards the liquid crystal material) that are formed in a third dielectric layer in layer 108. A common electrode on which a common power supply voltage Vcom is provided for display 14 may be formed in a fourth dielectric layer that is different than the third dielectric layer in layer 108.

In general, reflective structure 150 may be formed in any one of the dielectric layers in layer 108 and may be formed using the same material with which TFT gate structures are formed, the same material with which the active source-drain material is formed, the same material with which the pixel electrodes are formed, the same material with which the common electrodes are formed, aluminum, copper, molybdenum, polysilicon, tungsten, silver, gold, a combination of these materials, or other suitable reflective material. It is generally desirable to select a material with relatively high reflectivity (e.g., at least 90% reflectance, at least 80% reflectance, at least 40% reflectance, etc.) so that user 48 can readily detect the information shown in area 90 in the presence of ambient light.

In the example of FIG. 8, reflective structure 150 may completely overlap the TFT black mask opening in region 90 and should have edges that extend laterally beyond the TFT black mask opening. Formed in this way, reflective structure 150 may have a footprint that is at least equal to or greater than the TFT black mask opening and need not be precisely patterned as long as structure 150 is substantially aligned under the opening(s) in area 90. For example, consider a scenario in which a circular opening is formed in black masking layer 102. In this scenario, structure 150 may be a rectangular reflective plate having a center that is aligned to the center of the circular opening and having a length and a width that are both greater than the diameter of the circular opening.

Figure 9:
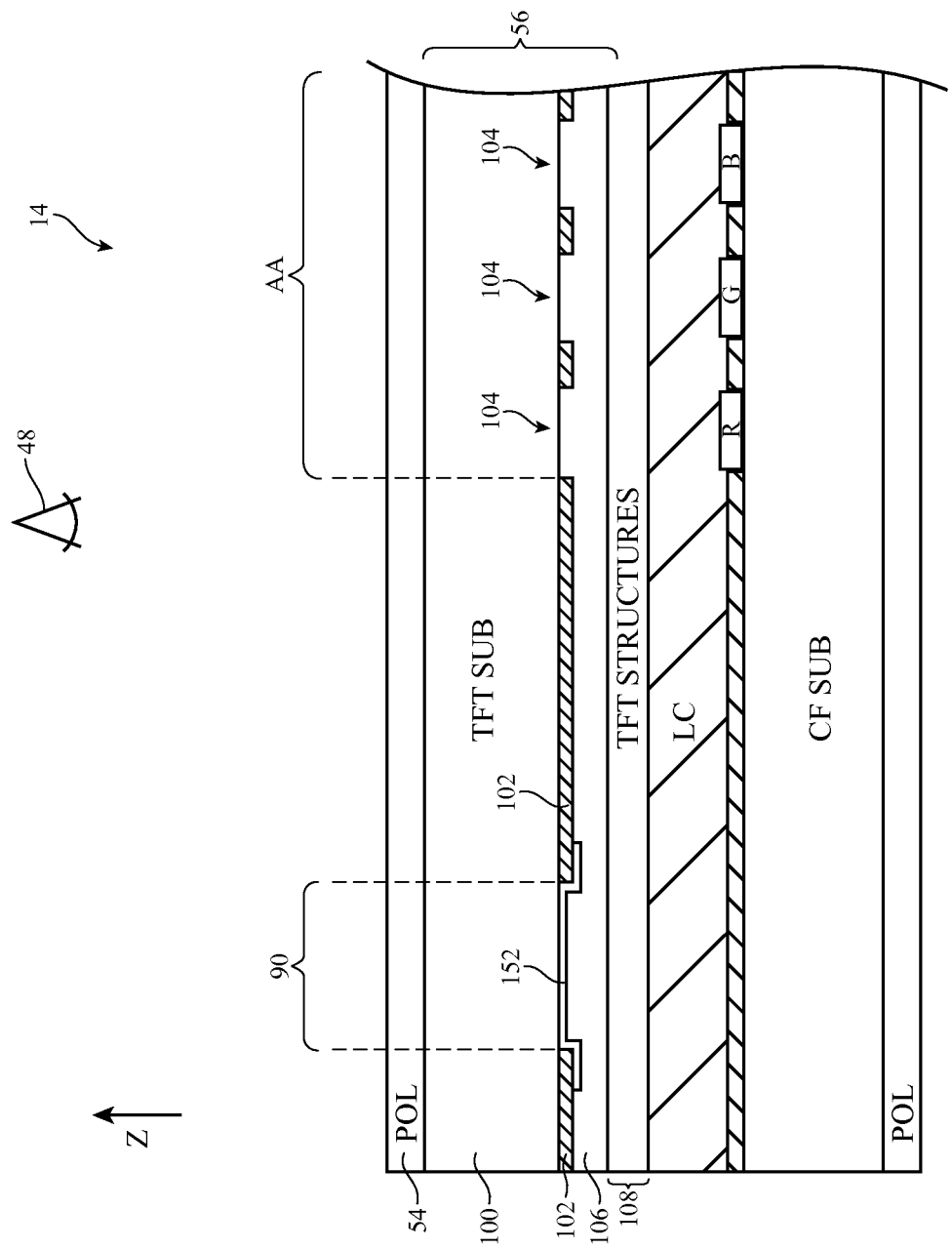
FIG. 9 is a cross-sectional side view of an illustrative display having logo reflective structures formed in a thin-film transistor planarization layer in accordance with an embodiment.

FIG. 9 shows another suitable arrangement of display 14 in which a reflective structure such as reflective structure 152 fills the opening in TFT black masking layer 102. For example, during formation of thin-film transistor layer 56, black masking layer 102 may first be formed on TFT substrate 100. At a subsequent step, an array of slots 104 may be formed in active area AA, whereas at least one opening may be formed in area 90. After the slots/opening(s) have been formed, reflective structure 152 (e.g., a thin layer of aluminum) may be patterned over the black masking layer opening in area 90. If desired, reflective structure 152 may be formed using any suitable reflective material and may have edges that extend beyond the borders of the masking layer opening to ensure that the opening is completely filled. At a subsequent step, planarization layer 106 may be formed over substrate 100 to planarize the TFT black masking structures 102. The TFT structures in layer 108 may then be formed on planarization layer 106. To implement the configuration of FIG. 9, an additional mask may be required for patterning structure 152 after forming holes in TFT black masking layer 102 and prior to forming planarization layer 106.

Figure 10:
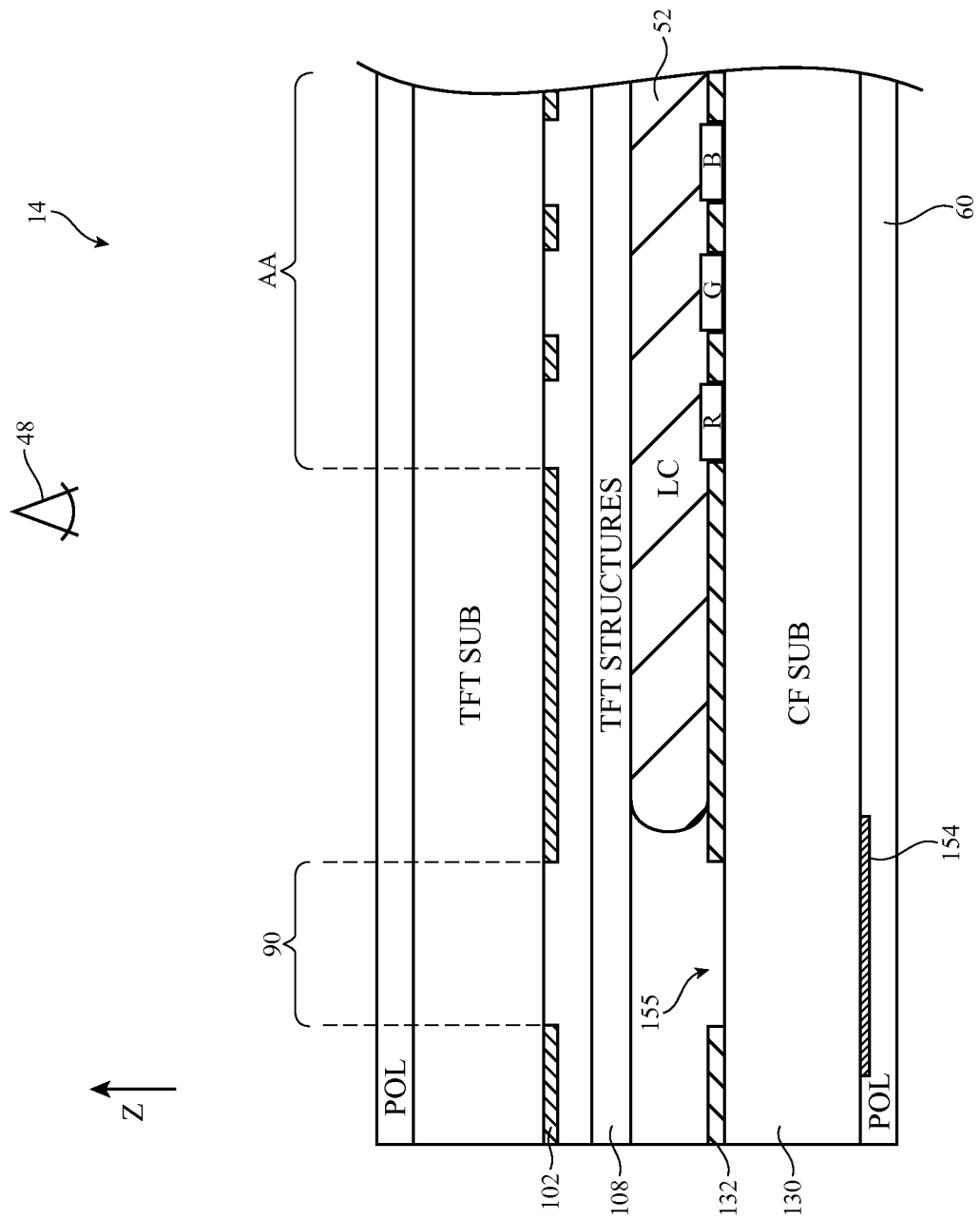
FIG. 10 is a cross-sectional side view of an illustrative display having logo reflective structures formed on a bottom surface of a color filter substrate in accordance with an embodiment.

FIG. 10 shows another suitable arrangement of display 14 in which a reflective structure such as a reflective tape 154 may be laminated to the bottom surface of color filter substrate 130. Reflective tape 154 may have a reflective carrier and an adhesive layer that serves to adhere the reflective carrier to CF layer substrate 130. As shown in FIG. 10, an additional hole such as hole 155 may be formed in the color filter black masking layer 132. Hole 155 may be aligned with the hole in the TFT black masking layer 102 and may have the same shape as the hole in TFT black masking layer 102. If desired, hole 155 may larger than the hole in TFT black making layer 102. Formed in this way, light may travel through the aligned openings in layers 102 and 132 and may be reflected back out towards user 48 using reflective structure 154.

In the example of FIG. 10, a void may be formed over hole 155 by making liquid crystal material 52 does not extend over opening 155. The void over hole 155 may be occupied by air or other suitable transparent material with high transmittance (e.g., with at least 50% transmittance, at least 60% transmittance, at least 70% transmittance, at least 80% transmittance, at least 90% transmittance, etc.). This is merely illustrative. If desired, hole 155 may be filled with liquid crystal material 52.

Figure 11:
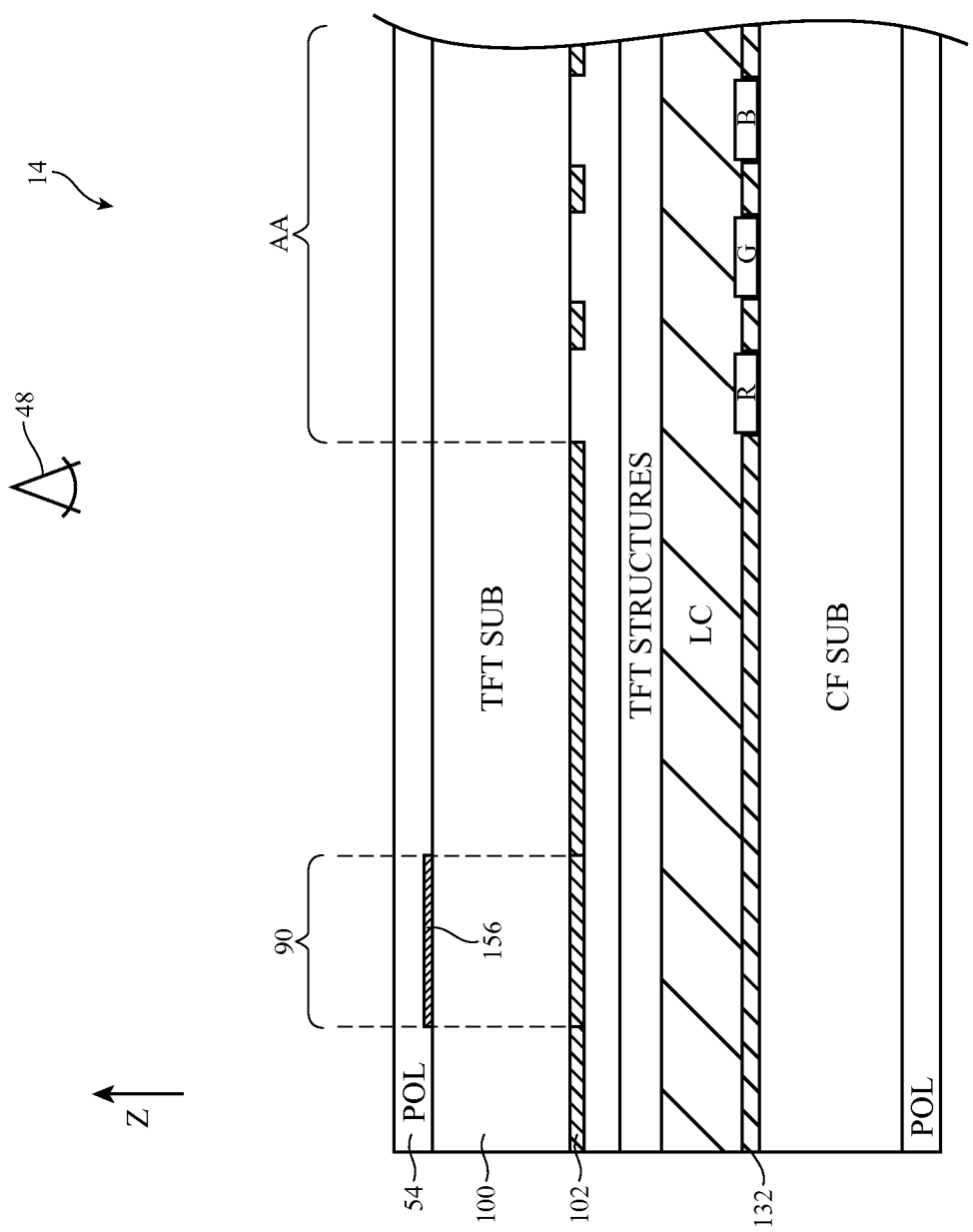
FIG. 11 is a cross-sectional side view of an illustrative display having logo reflective structures formed on a top surface of a thin-film transistor substrate in accordance with an embodiment.

FIG. 11 shows another suitable arrangement of display 14 in which a reflective structure such as a reflective tap 156 may be laminated to the outer surface of TFT substrate layer 100. Reflective tape 156 may have a reflective carrier and an adhesive layer that serves to adhere the reflective carrier to TFT layer substrate 100. Tape 156 should have the exact shape of the logo or symbol that is to be displayed in area 90 (e.g., the shape and size of the logo in region 90 is determined directly by the shape and size of tape 156 and not by openings formed in layers 102 and/or 132 (as in the examples of FIGS. 8-10). In fact, no opening in the TFT black masking layer 102 and the CF black masking layer 132 need to be formed beneath reflective structure 156 in area 90.

Figure 12:
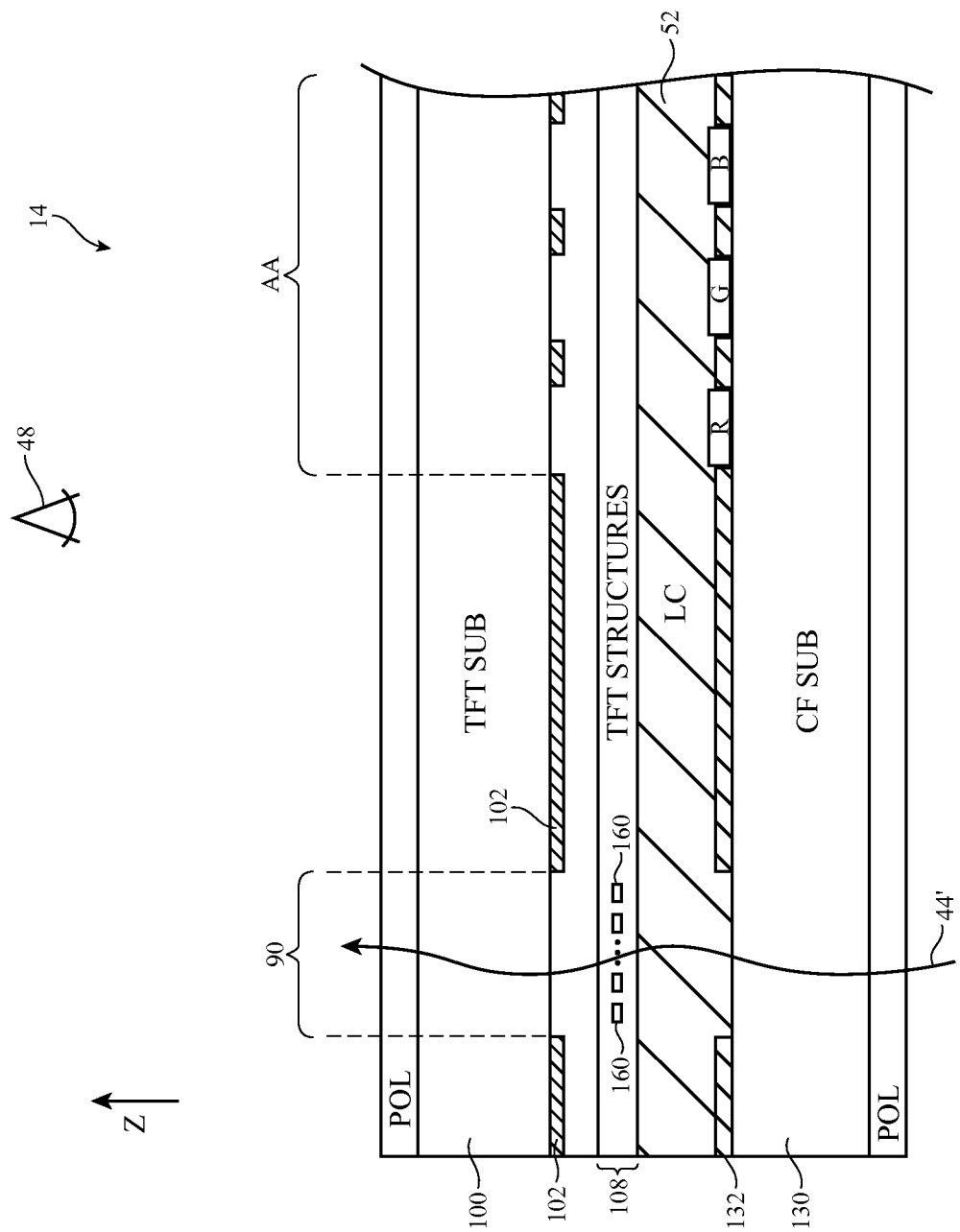
FIG. 12 is a cross-sectional side view of an illustrative display having a backlit logo area in accordance with an embodiment.

The configurations of display 14 in FIGS. 8-11 employ reflective mechanisms to display static information in area 90. In yet another suitable embodiment, display 14 may employ a transmission mechanism that allows area 90 to be backlit (see, e.g., FIG. 12). As shown in FIG. 12, a first hole may be formed in TFT black masking layer 102, whereas a second hole may be formed in CF black masking layer 132. The first hole may be formed to have the exact shape of the logo, symbol(s), or design that is to be displayed to the user. The second hole may be aligned to the first hole and may have a footprint that is at least equal to that of the first hole. If desired, one or more holes may be formed in layers 102 and 132 in area 90.

Backlight 44' may be transmitted through CF substrate 130, the second hole in CF black masking layer 132, liquid crystal material 52, the first hole in TFT black masking layer 102, and TFT substrate 100 to illuminate area 90. Backlight 44' may be emitted from a separate backlight unit that is controlled independently of the main backlight unit that is being used to illuminate the active area AA of display 14. If desired, backlight 44' may be provided from the same backlight unit that is being used to illuminate area AA of display 14.

In the example of FIG. 12, pixel electrodes structures such as electrodes 160 may be formed in layer 108 in region 90 of the display. The voltages on electrodes 160 may be tuned in real time to selectively apply electric fields to the liquid crystal material 52 in area 90. In other words, the brightness and/or color of area 90 may be dynamically adjusted during operation of device 10 by applying appropriate voltages to electrodes 160. For example, a logo that is being displayed in area 90 may be dimmed when ambient light levels are low (e.g., as detected using an ambient light sensor in device 10) or when device 10 is operating in a power savings mode. As another example, area 90 may implement one or more seven-segment displays for dynamically displaying numerical or alphabetical information. By controlling the brightness of each segment in each seven-segment display indicator, different numbers and characters may be output to the user. As yet another example, a power indicator that is being displayed in area 90 may be visible to the user when the display is powered on, may be invisible to the user when the display is powered off, or may be changed to a different color when the display is idle.

In the active area AA of display 14, the amount of light transmitted through each subpixel can be controlled using display control circuitry and electrodes. Each subpixel may, for example, be provided with a transparent indium tin oxide electrode. The signal on the subpixel electrode, which controls the electric field through an associated portion of the liquid crystal layer and thereby controls the light transmission for the subpixel, may be applied using a thin film transistor. The thin film transistor may receive data signals from data lines and, when turned on by an associated gate line, may apply the data line signals to the electrode that is associated with that thin-film transistor.

Figure 13:
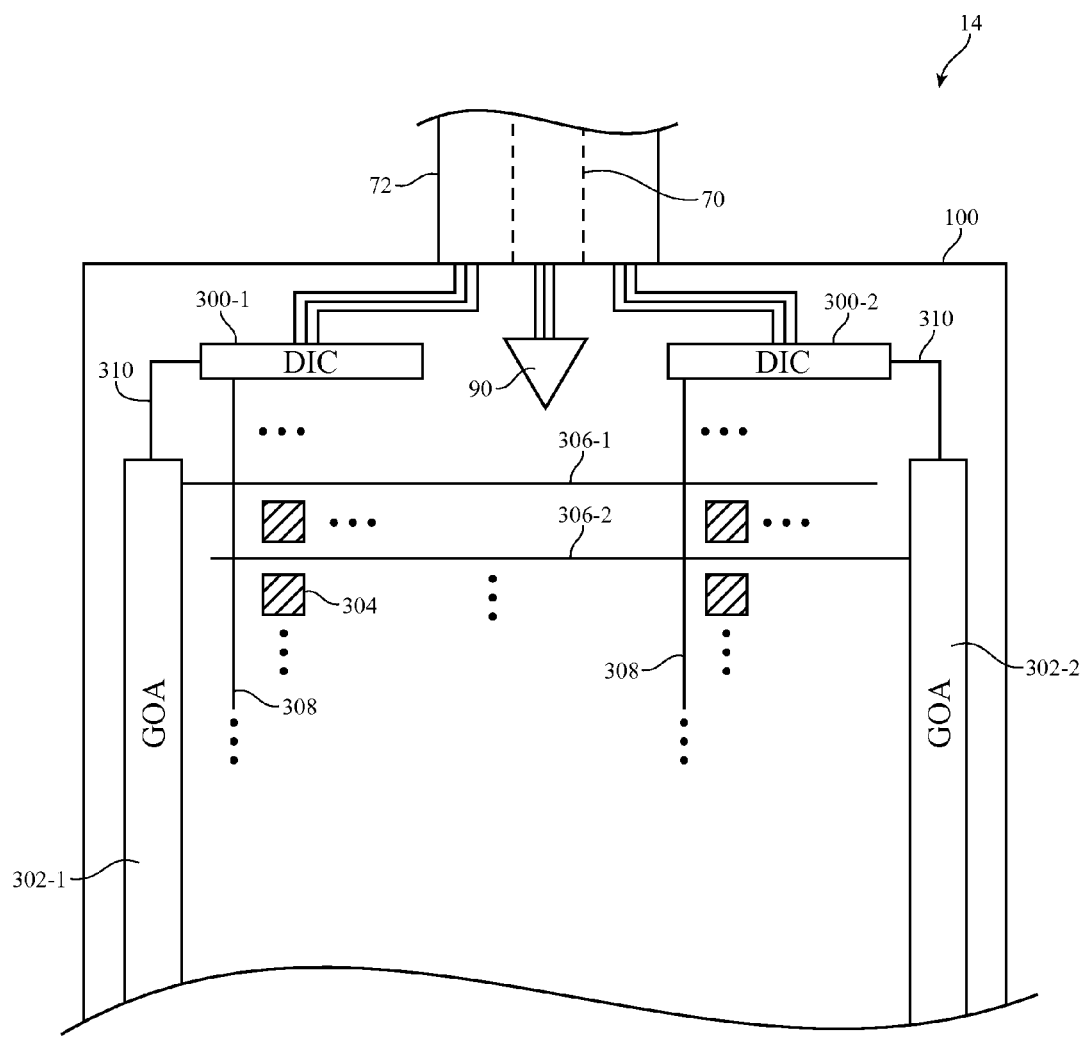
FIG. 13 is a diagram showing how a display may be provided with display data and control signals in accordance with an embodiment of the present invention.

A top view of an illustrative display is shown in FIG. 13. As shown in FIG. 13, display 14 may include an array of image pixels 304. Pixels 304 (which are sometimes referred to as subpixels) may each be formed from electrodes that give rise to an electric field and a portion of the liquid crystal layer 52 (FIG. 6) that is controlled by that electric field. Each image pixel may have an electrode that receives a data line signal from an associated transistor and a common electrode. The common electrodes of display 14 may be formed from a layer of patterned indium tin oxide or other conductive planar structures. The patterned indium tin oxide structure or other conductive structures that are used in forming the common plane for image pixels 304 may also be used in forming capacitive touch sensor elements (not shown).

Display 14 may include display driver circuitry 300 (e.g., display driver circuits 300-1 and 300-2). Display driver circuitry 300 may receive image data from processing circuitry in device 10 using conductive lines 70 in path 72. Path 72 may be, for example, a flex circuit cable or other communications path that couples display driver circuitry 300 to integrated circuits on a printed circuit board elsewhere in device 10 (as an example).

Display driver circuitry 300 may be coupled to gate line driver circuit 302-1 and gate line driver circuit 302-2. Display driver control circuits 300-1 and 300-2 may be implemented using one or more integrated circuits (e.g., one or more display driver integrated circuits). Circuits 302-1 and 302-2 (sometimes referred to as gate line and Vcom driver circuitry) may be incorporated into control circuit 300 or may be implemented using thin-film transistors on layer 100 (FIGS. 8-12). Gate line driver circuits 302-1 and 302-2 implemented using thin-film transistor structures on layer 100 may sometimes be referred to as gate driver on array or "GOA." Paths such as paths 310 may be used to interconnect display driver circuitry 300. Display driver circuitry 300 may also be implemented using external circuits or other combinations of circuitry, if desired.

The display driver circuitry and the gate line driver circuitry may control the operation of display 10 using a grid of signal lines such as data lines 308, gate lines 306, and Vcom lines (not shown). In the example of FIG. 13, gate driver circuit 302-1 may serve to provide gate line signals to display pixels 304 arranged along even rows in the array (e.g., by supplying gate line signals on even gate lines 306-1), whereas gate driver circuit 302-2 may serve to provide gate line signals to display pixels 304 arranged along odd rows in the array (e.g., by supplying gate line signals on odd gate lines 306-2). This type of interlaced driving scheme in which gate line driver circuits drive signals from two different sides of the array in this way is merely illustrative. In general, gate drivers may be formed on only one side, or on more than two sides of the image pixel array.

In the example of FIG. 13, structures in area 90 may directly receive data/control signals from processing circuitry in device 10 using conductive lines 70 in path 72. Connected in this way, control circuitry on a printed circuit board elsewhere in device 10 may directly control the brightness, color, and/or the content of information being display in area 90. As opposed to the active area of display 14, area 90 need not include any gating thin-film transistors for selectively passing through display data. In contrast, area 90 may be passively driven (i.e., driven without the use of active gating thin-film transistors) by directly applying external control voltages to electrodes 160 in region 90 (see, e.g., FIG. 12).

Figure 14:
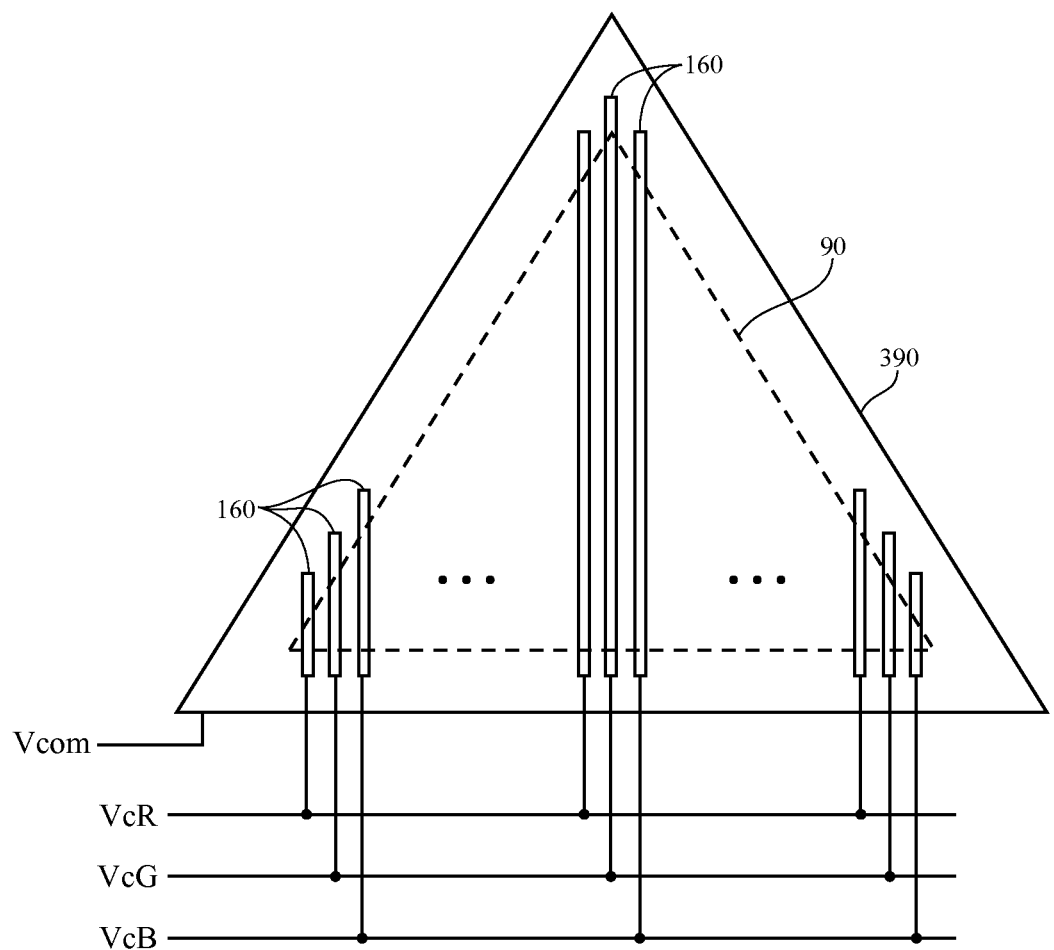
FIG. 14 is a diagram showing how different electrodes for controlling the color of a backlit logo area may be interconnected in accordance with an embodiment of the present invention.
Figure 15:
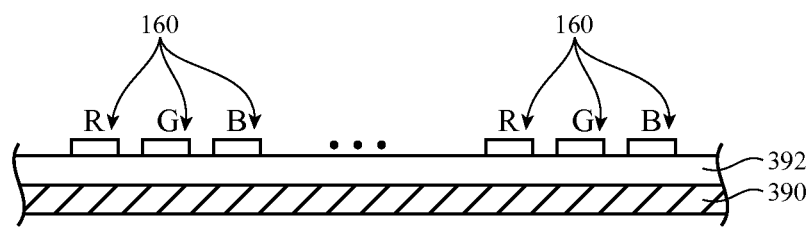
FIG. 15 is a cross-sectional side view showing how the electrodes of FIG. 14 may be formed over a blanket common voltage layer in accordance with an embodiment of the present invention.

FIG. 14 is a diagram showing how electrodes 160 in area 90 may be controlled. As shown in FIG. 14, multiple parallel segments of electrodes 160 may be formed in region 90. Each electrode segment 160 may extend beyond the border of area 90 to ensure that the edges of area are evenly lit. A blanket layer such as layer 390 may be formed below electrodes 160 that at least overlaps with area 90 (see, e.g., FIG. 15). Blanket layer 390 may be driven to a common power supply voltage Vcom. As shown in FIG. 15, a passivation/dielectric layer 392 may be interposed between the Vcom layer 390 and electrode structures 160. Configured in this way, electrodes 160 can be used to apply electric fields that extend from the electrodes to the Vcom layer and that control the liquid crystal material in the display.

Referring back to FIG. 14, a first group of electrodes may be coupled to a first control path on which a first control signal VcR is provided. A second group of electrodes may be coupled to a second control path on which a second control signal VcG is provided. A third group of electrodes may be coupled to a third control path on which a third control signal VcB is provided.

In order to provide adjustable color in area 90, corresponding color filter elements may be formed within the opening in CF black masking layer 132 at region 90. For example, stripes of red color filter elements may be formed directly below the first group of electrodes; stripes of green color filter elements may be formed directly below the second group of electrodes; and stripes of blue color filter elements may be formed directly below the third group of electrodes. Control signals VcR, VcG, and VcB may be independently controlled to adjust the brightness and color of the light that is being emitted in area 90. For example, if VcR, VcG, and VcB are all deasserted, area 90 may appear black. As another example, if VcR, VcG, and VcB are all asserted, area 90 may appear white. As yet another example, if only VcR is asserted while VcG and VcB are deasserted, area 90 may appear red. As yet another example, if VcR, VcG, and VcB are partially asserted, area 90 may appear gray. These examples are merely illustrative and do not limit the scope of the present invention. In general, other ways of illuminating the border display 90 may be implemented for presenting any type of useful information to a user of device 10.

The foregoing is merely illustrative and various modifications can be made by those skilled in the art without departing from the scope and spirit of the described embodiments. The foregoing embodiments may be implemented individually or in any combination.

What is claimed is:

1. Display circuitry having an active display area surrounded by an inactive border area, comprising:
   a thin-film transistor substrate;
   a color filter substrate;
   a backlight unit, wherein the color filter substrate is interposed between the backlight unit and the thin-film transistor substrate; and
   a reflective structure that is formed in the inactive border area and that reflects ambient light to display predetermined information.

2. The display circuitry as defined in claim 1, further comprising:
   an opaque masking layer formed on the thin-film transistor substrate, wherein the reflective structure is aligned with at least one hole in the opaque masking layer.

3. The display circuitry as defined in claim 2, wherein the reflective structure has a footprint that is larger than the hole in the opaque masking layer.

4. The display circuitry as defined in claim 2, further comprising:
   a planarization layer formed over the opaque masking layer; and
   a plurality of layers in which thin-film transistor structures are formed, wherein the plurality of layers are formed on the planarization layer, and wherein the reflective structure is formed in a selected layer in the plurality of layers.

5. The display circuitry as defined in claim 2, further comprising:
 a planarization layer formed over the opaque masking layer, wherein the reflective structure fills the hole in the opaque masking layer, and wherein the reflective structure is interposed between the planarization layer and the thin-film transistor substrate.

6. The display circuitry as defined in claim 2, further comprising:
 an additional opaque masking layer formed on a first surface of the color filter substrate, wherein the reflective structure is formed on a second surface of the color filter substrate that is different than the first surface.

7. The display circuitry as defined in claim 1, further comprising:
 opaque masking material formed on a first surface of the thin-film transistor substrate, wherein the reflective structure is formed on a second surface of the thin-film transistor substrate that is different than the first surface.

8. The display circuitry as defined in claim 1, further comprising:
 liquid crystal material interposed between the thin-film transistor substrate and the color filter substrate.

9. Display circuitry having an active display area surrounded by an inactive border area, comprising:
 a thin-film transistor substrate;
 a color filter substrate;
 a first black masking layer that is formed on the thin-film transistor substrate and that has a first opening in the inactive border area; and
 a second black masking layer that is formed on the color filter substrate and that has a second opening in the inactive border area, wherein the second opening is aligned with the first opening.

10. The display circuitry as defined in claim 9, further comprising:
 a backlight unit, wherein the color filter substrate is interposed between the backlight unit and the thin-film transistor substrate.

11. The display circuitry as defined in claim 10, further comprising:
 a reflective tape that is formed on the color filter substrate, wherein the reflective tape and the second black masking layer are formed on opposing surfaces of the color filter substrate, and wherein the reflective tape is aligned with the first and second openings.

12. The display circuitry as defined in claim 10, further comprising:
 liquid crystal material interposed between the thin-film transistor substrate and the color filter substrate.

13. The display circuitry as defined in claim 12, further comprising:
 electrode structures for controlling light that passes through the first and second openings.

14. The display circuitry as defined in claim 13, wherein the electrode structures control the amount of light that passes through the first and second openings.

15. The display circuitry as defined in claim 13, wherein the electrode structures control the color of light that passes through the first and second openings.

16. An electronic device display, comprising:
 a thin-film transistor layer;
 a color filter layer; and
 a backlight unit, wherein the color filter layer is interposed between the backlight unit and the thin-film transistor layer;
 an array of thin-film transistors formed in the thin-film transistor layer in an active area of the display; and
 a symbol that is displayed in an inactive area of the display that surrounds the active area.

17. The electronic device display of claim 16, further comprising:
 a polarizer layer formed on the thin-film transistor layer, wherein the polarizer layer serves as an outer surface of the display.

18. The electronic device display of claim 16, further comprising:
 reflective structures that reflect ambient light.

19. The electronic device display of claim 18, further comprising:
 a light blocking layer formed on the thin-film transistor layer, wherein the reflective structures are aligned with at least one opening in the light blocking layer.

20. The electronic device display of claim 16, wherein the symbol is backlit.

\* \* \* \* \*